(12) United States Patent
Herr et al.

(10) Patent No.: US 12,156,484 B2
(45) Date of Patent: Nov. 26, 2024

(54) FABRICATION STACK FOR HIGH INTEGRATION DENSITY SUPERCONDUCTING DIGITAL CIRCUITS

(71) Applicant: IMEC USA NANOELECTRONICS DESIGN CENTER, Inc., Kissimmee, FL (US)

(72) Inventors: Anna Yurievna Herr, Leuven (BE); Quentin Paul Herr, Leuven (BE)

(73) Assignee: Trading Technologies International, Inc., Chicago, IL (US)

( * ) Notice: Subject to any disclaimer, the term of this patent is extended or adjusted under 35 U.S.C. 154(b) by 0 days.

(21) Appl. No.: 17/561,075

(22) Filed: Dec. 23, 2021

(65) Prior Publication Data
US 2023/0210022 A1    Jun. 29, 2023

(51) Int. Cl.
*H10N 69/00*  (2023.01)
*H01L 49/02*  (2006.01)
*H10N 60/01*  (2023.01)
*H10N 60/12*  (2023.01)
*H10N 60/80*  (2023.01)

(52) U.S. Cl.
CPC ............ *H10N 69/00* (2023.02); *H01L 28/10* (2013.01); *H01L 28/60* (2013.01); *H10N 60/0912* (2023.02); *H10N 60/12* (2023.02); *H10N 60/805* (2023.02)

(58) Field of Classification Search
CPC ..................................................... H10N 69/00
See application file for complete search history.

(56) References Cited

U.S. PATENT DOCUMENTS

| | | | |
|---|---|---|---|
| 4,220,959 A * | 9/1980 | Kroger | H10N 60/12 327/528 |
| 5,462,762 A * | 10/1995 | Onuma | B82Y 10/00 427/63 |
| 9,292,642 B2 | 3/2016 | Herr et al. | |
| 9,466,643 B2 | 10/2016 | Herr et al. | |
| 9,722,589 B1 | 8/2017 | Talanov et al. | |
| 10,133,299 B1 | 11/2018 | Strong et al. | |
| 10,431,867 B1 | 10/2019 | Strong et al. | |
| 10,474,183 B2 | 11/2019 | Strong et al. | |
| 10,520,974 B2 | 12/2019 | Strong et al. | |
| 10,608,044 B1 | 3/2020 | Herr et al. | |
| 10,754,371 B1 | 8/2020 | Strong et al. | |
| 10,884,450 B2 | 1/2021 | Strong et al. | |

(Continued)

OTHER PUBLICATIONS

Herr, Quentin P., Anna Y. Herr, Oliver T. Oberg, and Alexander G. Ioannidis. "Ultra-low-power superconductor logic." Journal of applied physics 109, No. 10 (2011): 103903.

(Continued)

*Primary Examiner* — Matthew L Reames
(74) *Attorney, Agent, or Firm* — McDonnell Boehnen Hulbert & Berghoff LLP (57) ABSTRACT

A fabrication stack comprises at least one Josephson junction, at least one capacitor, and one or more high kinetic inductance wires that comprise NbTiN. The one or more high kinetic inductance wires are configured to electrically couple the at least one Josephson junction to the at least one capacitor to form a superconducting circuit that facilitates switching a state of the Josephson junction via a single flux quantum (SFQ) pulse.

22 Claims, 6 Drawing Sheets

(56) References Cited

U.S. PATENT DOCUMENTS

| | | | | |
|---|---|---|---|---|
| 2015/0119253 | A1* | 4/2015 | Yohannes | H10N 69/00 |
| | | | | 505/190 |
| 2018/0138389 | A1* | 5/2018 | Kirby | H10N 60/0156 |
| 2020/0144476 | A1* | 5/2020 | Huang | H01L 23/528 |
| 2020/0266234 | A1* | 8/2020 | Boothby | H01L 28/60 |
| 2020/0287118 | A1 | 9/2020 | Herr et al. | |

OTHER PUBLICATIONS

Herr, Anna Y., Quentin P. Herr, Oliver T. Oberg, Ofer Naaman, John X. Przybysz, Pavel Borodulin, and Steven B. Shauck. "An 8-bit carry look-ahead adder with 150 ps latency and sub-microwatt power dissipation at 10 GHz." Journal of Applied Physics 113, No. 3 (2013): 033911.

Hosoya, Mutsumi, Willy Hioe, Juan Casas, Ryotaro Kamikawai, Yutaka Harada, Yasou Wada, Hideaki Nakane, Reiji Suda, and Eiichi Goto. "Quantum flux parametron: a single quantum flux device for Josephson supercomputer." IEEE Transactions on Applied Superconductivity 1, No. 2 (1991): 77-89.

Talanov, Vladimir V., Derek Knee, David Harms, Kieran Perkins, Andrew Urbanas, Jonathan Egan, Quentin Herr, and Anna Herr. "Propagation of Picosecond Pulses on Superconducting Transmission Line Interconnects." arXiv preprint arXiv:2104.07371 (2021).

Tolpygo, Sergey K., Vladimir Bolkhovsky, Ravi Rastogi, Scott Zarr, Evan Golden, Terence J. Weir, Leonard M. Johnson, Vasili K. Semenov, and Mark A. Gouker. "A 150-nm node of an eight-Nb-layer fully planarized process for superconductor electronics." In Proc. ASC2020 Conf. 2020.

Tolpygo, Sergey K., and Denis Amparo. "Fabrication-process-induced variations of Nb/Al/AlOx/Nb Josephson junctions in superconductor integrated circuits." Superconductor Science and Technology 23, No. 3 (2010): 034024.

Tolpygo, Sergey K., and Vasili K. Semenov. "Increasing integration scale of superconductor electronics beyond one million Josephson junctions." In Journal of Physics: Conference Series, vol. 1559, No. 1, p. 012002. IOP Publishing, 2020.

Henry, M. David, S. W. Smith, R. M. Lewis, and J. F. Ihlefeld. "Stabilization of ferroelectric phase of $Hf0.58Zr0.42O2$ on NbN at 4 K." Applied Physics Letters 114, No. 9 (2019): 092903.

Olaya, David, Paul D. Dresselhaus, Samuel P. Benz, Jon Bjarnason, and Erich N. Grossman. "Amorphous Nb—Si barrier junctions for voltage standard and digital applications." IEEE transactions on applied superconductivity 19, No. 3 (2009): 144-148.

Aldrigo, M., M. Dragoman, E. Laudadio, S. Iordanescu, M. Modreanu, I. M. Povey, F. Nastase et al. "Microwave applications of zirconium-doped hafnium oxide ferroelectrics: From nanoscale calculations up to experimental results." In 2020 IEEE/MTT-S International Microwave Symposium (IMS), pp. 520-523. IEEE, 2020.

Holmes, D. Scott, Andrew L. Ripple, and Marc A. Manheimer. "Energy-efficient superconducting computing—Power budgets and requirements." IEEE Transactions on Applied Superconductivity 23, No. 3 (2013): 1701610-1701610.

Kroger, H., L. Smith, D. Jillie, J. Thaxter, R. Aucoin, L. Currier, C. Potter, D. Shaw, and P. Willis. "Hydrogenated amorphous silicon barriers for niobium-niobium Josephson junctions." IEEE Transactions on Magnetics 21, No. 2 (1985): 870-873.

"Cryogenic Electronics and Quantum Information Processing", International Roadmap for Devices and Systems, IEEE 2020, 83 pages.

* cited by examiner

FABRICATION STACK FOR HIGH INTEGRATION DENSITY SUPERCONDUCTING DIGITAL CIRCUITS

FIELD OF THE DISCLOSURE

This application relates to superconducting circuits. In particular, this application discloses a fabrication stack for high integration density superconducting digital circuits.

BACKGROUND

Superconducting digital systems are capable of performing computing operations at clock speeds in excess of 100 GHz. In these systems, the circuits comprise superconducting wires and Josephson junctions that together form superconducting loops in which information in the form of a single flux magnetic quantum (SFQ) is encoded and stored.

The superconducting circuits can be configured to implement traditional logic gates such as AND gates, OR gates, Flip Flops, etc. These gates, in turn, can be configured to implement more complex logic such as shift registers, counters, processors, etc.

Manufacturing superconducting digital systems at scale is difficult due to fabrication limitations related to power distribution, logic efficiency, and memory density.

SUMMARY

In a first aspect, a fabrication stack comprises at least one Josephson junction, at least one capacitor, and one or more high kinetic inductance wires that comprise NbTiN. The high kinetic inductance wires are configured to electrically couple the at least one Josephson junction to the at least one capacitor to form a superconducting circuit that facilitates switching a state of the Josephson junction via a single flux quantum (SFQ) pulse.

In a second aspect, a method for fabricating a superconducting circuit comprises forming, in a fabrication stack, at least one Josephson junction, at least one capacitor, and one or more high kinetic inductance wires that comprise NbTiN. The one or more high kinetic inductance wires are configured to electrically couple the at least one Josephson junction to the at least one capacitor to form a superconducting circuit that facilitates switching a state of the Josephson junction via a single flux quantum (SFQ) pulse.

In a third aspect, a device comprises a superconducting chip. The superconducting chip comprises a fabrication stack that comprises at least one Josephson junction, at least one capacitor, and one or more high kinetic inductance wires that comprise NbTiN. The one or more high kinetic inductance wires are configured to electrically couple the at least one Josephson junction to the at least one capacitor to form a superconducting circuit that facilitates switching a state of the Josephson junction via a single flux quantum (SFQ) pulse.

BRIEF DESCRIPTION OF THE FIGURES

The above, as well as additional features, will be better understood through the following illustrative and non-limiting detailed description of example embodiments, with reference to the appended drawings.

All the figures are schematic, not necessarily to scale, and generally only show parts that are necessary to elucidate example embodiments, wherein other parts may be omitted or merely suggested.

DETAILED DESCRIPTION

Various examples of systems, devices, and/or methods are described herein with reference to the accompanying drawings. Any embodiment, implementation, and/or feature described herein as being an example is not necessarily to be construed as preferred or advantageous over any other embodiment, implementation, and/or feature unless stated as such. Thus, other embodiments, implementations, and/or features may be utilized, and other changes may be made without departing from the scope of the subject matter presented herein.

Accordingly, the examples described herein are not meant to be limiting. It will be readily understood that the aspects of the present disclosure, as generally described herein, and illustrated in the figures, can be arranged, substituted, combined, separated, and designed in a wide variety of different configurations.

Further, unless the context suggests otherwise, the features illustrated in each of the figures may be used in combination with one another. Thus, the figures should be generally viewed as component aspects of one or more overall embodiments, with the understanding that not all illustrated features are necessary for each embodiment.

Additionally, any enumeration of elements, blocks, or steps in this specification or the claims is for purposes of clarity. Thus, such enumeration should not be interpreted to require or imply that these elements, blocks, or steps adhere to a particular arrangement or are carried out in a particular order.

Moreover, terms such as "substantially" or "about" that may be used herein are meant that the recited characteristic, parameter, or value need not be achieved exactly, but that deviations or variations, including, for example, tolerances, measurement error, measurement accuracy limitations and other factors known to those skilled in the art, may occur in amounts that do not preclude the effect the characteristic was intended to provide.

Further, terms such as "A coupled to B," "A electrically coupled to B," etc., do not necessarily mean that items A and B are directly coupled to one another. For example, a first component electrically coupled to a second component is interpreted to mean that the components are either directly coupled (e.g., via a conductor) or coupled to one another via one or more resistors, capacitors, inductors, and/or other active or passive components.

As noted above, superconducting circuits comprise superconducting wires and Josephson junctions that together form superconducting loops in which information in the form of a single flux magnetic quantum (SFQ) is encoded and stored. Examples of the superconducting circuits correspond to quantum flux paramatron (QFP) and reciprocal quantum logic (RQL) circuits where both power and clock are provided by multi-phase alternating current signals.

The superconducting wires are formed from materials that can carry a direct electrical current (DC) in the absence of an electric field. Such materials have almost zero resistance at or below their critical temperature. One example of a superconductor, niobium, has a critical temperature ($T_c$) of 9.2 Kelvin. At temperatures below the critical temperature, niobium is superconductive. However, at temperatures above the critical temperature, niobium behaves like a normal metal with electrical resistance.

The Josephson junctions include two superconductors coupled via a region that impedes current. Examples of this region include or correspond to a physical narrowing of the superconductor itself, a metal region, or a thin insulating barrier. Some examples of Josephson junctions comprise niobium superconductors and an $Al_2O_3$ barrier therebetween. When the potential difference between the two superconductors is integrated with respect to time over one cycle of phase change, the magnetic flux through the loop changes by an integer multiple of a single quantum of magnetic flux. The voltage pulse associated with the single quantum of magnetic flux corresponds to the SFQ pulse referred to above. As an example, overdamped Josephson junctions can create individual SFQ pulses. In RQL circuits, each Josephson junction may be part of one or more superconducting loops. The phase difference across the junction may be modulated by the magnetic flux applied to the loop.

As noted above, manufacturing these types of circuits at scale is difficult due to fabrication limitations related to clock and power distribution, logic efficiency, and memory density. For example, conventional superconducting fabrication processes for digital circuits utilize Nb wiring and Nb/AlO$_x$/Nb Josephson junctions. As an elemental superconductor, Nb has a relatively high critical temperature of 9.2K and can be fabricated using conventional DC sputtering and etch processes. Nb based processes have enabled numerous demonstrations of superconducting circuits in academia and industry worldwide. However, more recent attempts to use Nb in pre-production processes with an increased number of metal layers and feature sizes down to 0.25 µm have run into fundamental scalability limitations. Issues include 1) unstable material properties caused by a low diffusion constant, affecting tolerances at sub-micron dimensions, 2) low inductance per unit length limiting density and signal integrity, 3) significant microwave losses due to inherent material properties and an easily contaminated surface, and 4) a relatively low processing temperature requirement, typically not to exceed 200° C. The low processing temperature gives rise to a long list of secondary issues that center on the dielectric, with the overall effect limiting feature size, layer count, and process control. Nb typically exhibits degradation of the superconducting properties top-to-bottom through the stack due to the cumulative effects of fabrication processing. Wire critical temperature distributions vary widely process-to-process and wafer-to-wafer. In some fabrication processes, further degradation occurs due to hydrogen poisoning. Material degradation mistargets inductance models and results in parameter spreads with increased sensitivity at small dimensions. A typical gate requires 140 pH of inductance. Using Nb results in 100× more area for the wiring than for the Josephson junctions. The excessive wiring results in tight meanders and high overhead in the routing layers. This is difficult to implement using automated routing methods that were designed to minimize total length. Nb wires without superconducting ground planes can have up to 50% mutual inductance making them sensitive to parasitic cross-net coupling and sequestered-flux moat coupling.

Some examples disclosed herein ameliorate some of these issues. For example, disclosed herein are several examples of a fabrication stack associated with a superconducting chip. The fabrication stack comprises one or more Josephson junctions, capacitors, and high kinetic inductance wires. The high kinetic inductance wires are configured to electrically couple the Josephson junctions to the capacitors to form superconducting circuits that facilitate switching a state of the Josephson junctions via a single flux quantum (SFQ) pulse. High kinetic inductance wires improve signal integrity and reduce parasitic magnetic coupling in the superconducting digital circuits.

In some examples, the high kinetic inductance wires comprise NbTiN, which has a London penetration depth $\lambda_L \approx 200$ nm and a kinetic inductance that can be expressed as $L_{sq} = \mu_o \lambda_L^2 / d$, where $\mu_o$ is the permeability constant of the material, and d is the film thickness of the material. The amount of inductance is set by adjusting the film thickness, d, of the material.

Further, NbTiN is amenable to a wide range of fabrication processes including conformal chemical vapor deposition (CVD) and atomic layer deposition (ALD), which facilitate damascene fill and high aspect ratio through-silicon vias (TSVs). Conformal high-temperature NbTiN with stable superconducting properties and thickness control down to 5 nm can be achieved via some of these processes.

Figure 1:
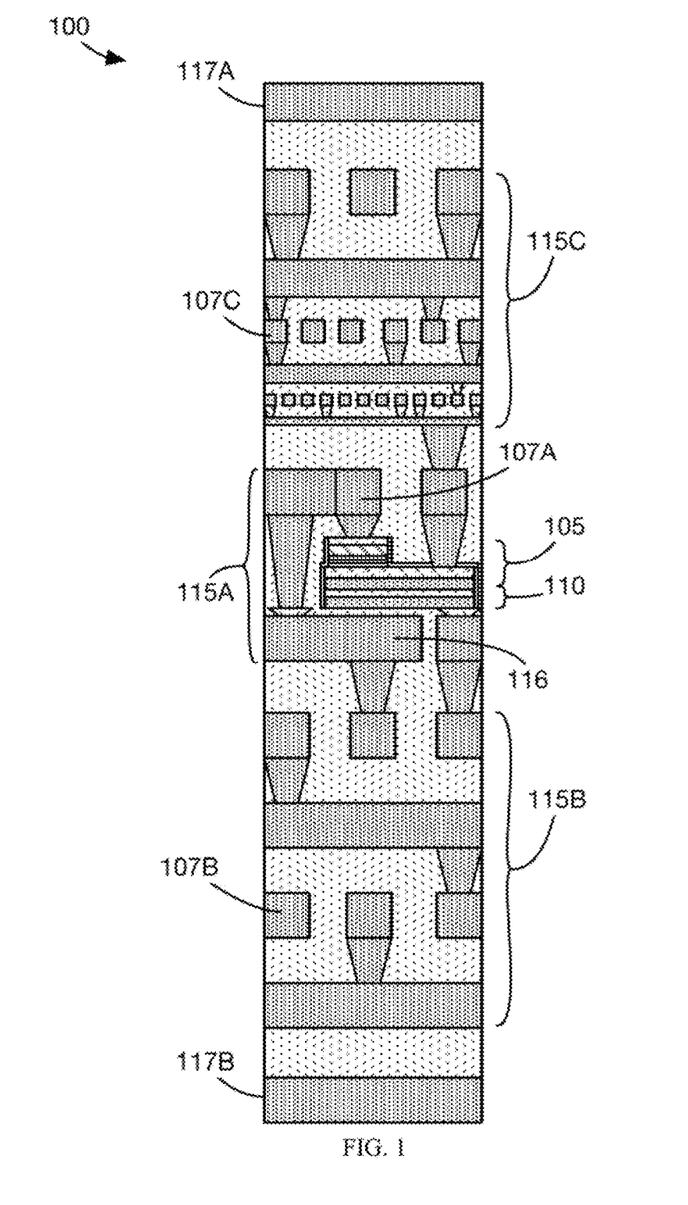
FIG. 1 illustrates a cross-section of a fabrication stack, in accordance with example embodiments.

FIG. 1 illustrates a cross-section of an example of a fabrication stack 100. The fabrication stack 100 comprises various groups of layers 115 in which are formed one or more power and clock interconnects, inductors, capacitors, Josephson junctions, etc., and superconducting circuits such as the RQL circuits described above. In some examples, one or more Josephson junctions 105, capacitors 110, high kinetic inductance wires 107A, and an intermediate ground plane 116 are formed within a first group of layers 115A. In an example, these high kinetic inductance wires electrically couple the Josephson junctions to the capacitors to form one or more superconducting series circuits configured to support signals in the form of a single flux quantum (SFQ). In some examples, high kinetic inductive wires 107B that facilitate power and clock distribution are formed within a second group of layers, hereinafter power distribution layers 115B. In some examples, high kinetic inductive wires 107C that implement local inductive lines and long passive transmission lines are formed within a third group of layers, hereinafter backend layers 115C. While various superconducting elements are described as being in particular layers or groups of layers, it is contemplated that these and/or other superconducting elements can be formed in different layers and that the order in which the elements are formed within these layers can be different. Further, while a particular number of layers is shown, it is understood that one or more aspects disclosed herein can be implemented in a different number of layers.

In some examples, the high kinetic inductive wires comprise NbTiN. The use of such a material facilitates the formation of digital circuits having low fabrication parameter-spread and high yield. SFQ circuit operating margin and speed are related to allowable spread in inductances, $\sigma_L$, with a typical requirement that one-sigma is 2% or better. NbTiN wiring layers facilitate this level of control or better with a much smaller feature size. Further, the ternary nitride NbTiN has a 1.8 times higher critical temperature (e.g., $T_c$=17.3 K) and 1.8 times higher gap voltage (e.g., $V_g$=5.2 mV). NbTiN films greater than 50 nm thickness reliably produce a $T_c$ above 16.6 K. NbTiN is not easily contaminated, so stable superconducting properties can be achieved with processing temperatures up to 1000° C. This includes exceptionally low residual resistivity. NbTiN having a high Ti composition (e.g., 45%) produces a low number of vacancies and high stability. NbTiN interconnects have 100 times lower losses than Nb, which translates into 10× higher throughput and 10× less energy per bit.

In some examples, wires within the power distribution layers 115B are configured to be electrically coupled to one or more alternating current (AC) voltage sources that output AC voltages having the same frequency and different phases. In some examples, the wires are configured to form a 2-dimensional mesh or interconnect. In some examples, each wire is associated with a particular phase and includes a first portion that is implemented on the first layer and a second portion that is implemented on the second layer. In some examples, one or more vias are implemented between the first and the second layers to couple the first and second conductor portions together. In some examples, the conductors associated with different phases are interleaved with one another.

Examples of the backend layers 105D comprise local inductive lines and long passive transmission lines. In some examples, resistive vias are utilized as terminations for the passive interconnects, for the interconnects inside the RQL gates, and as shunts. Additional aspects of the backend layers 105D are described below with reference to FIG. 2.

Some examples of the fabrication stack 100 comprise a pair of ground planes 117A, 117B between which the layers described above are formed. The ground planes 117A, 117B are configured to mitigate parasitic flux failure modes such as frozen Abrikosov vortexes and thermally induced phase slips that might otherwise occur within the fabrication stack 100 during cool down. Some examples of the ground planes 117A, 117B are formed from a NbTiN composition that has a higher concentration of Ti than the NbTiN composition used to form the inner layers, thereby increasing the critical temperature of the ground planes 117A, 117B. In an example, the difference between the respective critical temperatures is greater than 0.5 K.

Figure 2:
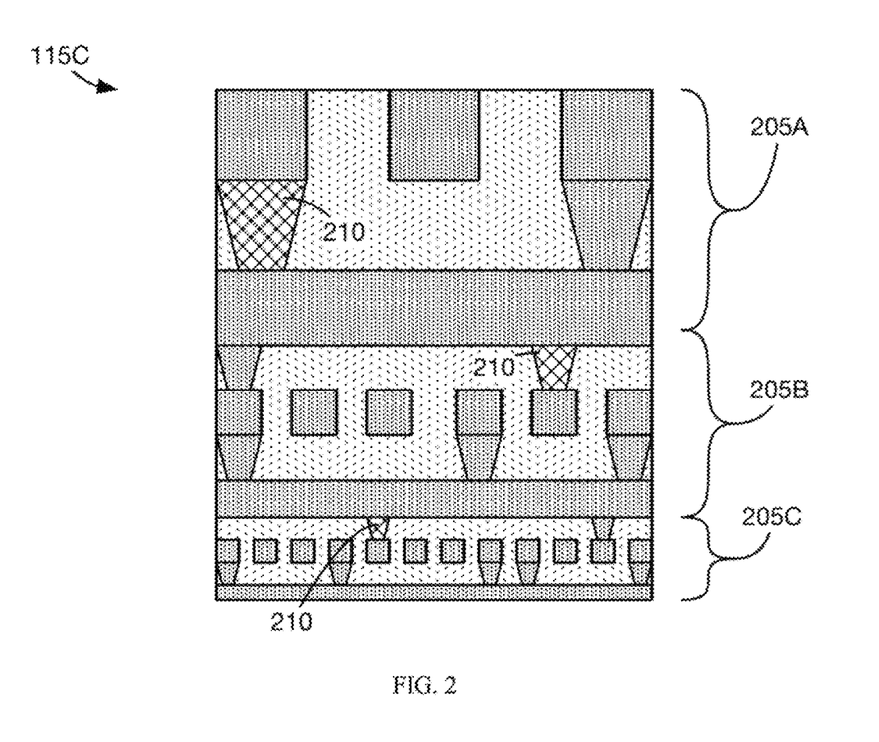
FIG. 2 illustrates backend layers of the fabrication stack, in accordance with example embodiments.

FIG. 2 illustrates an example of the backend layers 115C. The backend layers 115C comprise wires of different cross-sections that could facilitate dense routing. The wire cross-sections are sized to produce wires having different inductance values. In particular, as noted above, the kinetic inductance of the wires can be expressed as $L_{sq}=\mu_o\lambda_L^2/d$ and the amount of inductance can be adjusted by adjusting film thickness, d. For example, in first backend layers 205A, the wires have a thickness d=200 nm and, therefore, an inductance L=2 pH/μm and an impedance Z=88Ω. The wires in this layer have an inductive reach of 20 μm (about 10 gates) and a passive transmission line (PTL) reach of about 15 cm. In second backend layers 205B, the wires have a thickness d=100 nm and, therefore, an inductance L=5 pH/μm, and an impedance Z=155Ω. The wires in this layer have an inductive reach of 8 μm (about 4 gates) and a PTL reach of about 400 μm. In third backend layers 205C, the wires have a thickness d=50 nm and, therefore, an inductance L=20 pH/μm. The wires in this layer have an inductive reach of 2 μm (about 1 gate). The high kinetic inductance of NbTiN facilitates efficient routing as it makes inductance scale with cross-section, so there is 10× more inductance per μm in the third backend layers 205C than the first backend layers 205A. This simplifies routing methods for superconducting circuits with fixed inductance value targets with tight tolerances. Inductance targets can be met without meandering by accessing the different layers.

Some examples of the backend layers comprise resistive vias 210. In the superconducting context, the resistive vias 210 can be used in various applications, such as for matching impedances for transmission lines and for R/L (resistor/inductor) delay lines. In some examples, the resistance of these resistive vias 210 is between about 10Ω to 100Ω. Some examples of the resistive vias 210 comprise high resistivity $NbN_x$ with ρ=190-210 μΩ-cm, which is suitable for manufacturing resistors of the desired value in a via geometry.

Figure 3A:
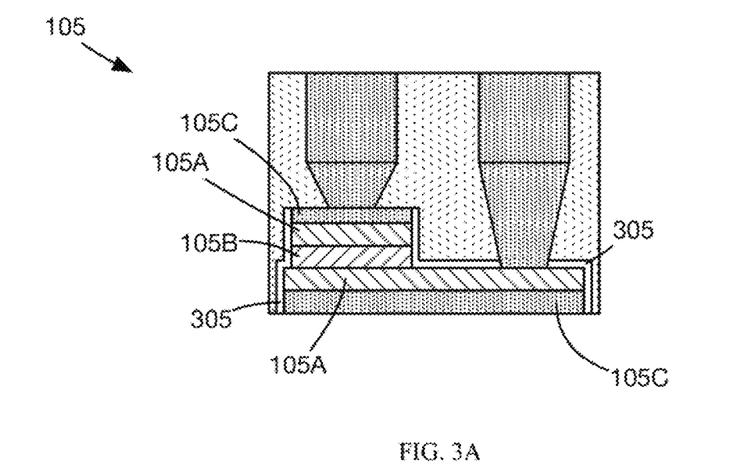
FIG. 3A illustrates a Josephson junction formed in the first group of layers of the fabrication stack, in accordance with example embodiments.

FIG. 3A illustrates an example of a Josephson junction 105 formed in the first group of layers 115A of the fabrication stack 100.

Some examples of the Josephson junction 105 comprise a pair of Nb electrode layers 105A, an amorphous silicon layer 105B between the pair of Nb electrode layers 105A, and a pair of NbTiN electrode layers 105C over the pair of Nb electrode layers 105A. The pair of Nb electrode layers 105A are configured to protect the pair of Nb electrode layers from contamination during the formation of the fabrication stack 100. For example, the NbTiN electrode layers 105B protect the top and bottom surfaces of the Nb electrode layers 105A from contamination.

Some examples of the Josephson junction 105 further comprise a silicon nitride layer 305 configured to encapsulate the other sides of the pair of Nb electrode layers 105A (e.g., sidewalls, perimeter, etc.). The silicon nitride layer 305 is configured to protect the other sides of the pair of Nb electrode layers from contamination during the formation of the fabrication stack 100. Thus, between the NbTiN electrode layers 105B and the silicon nitride layer 305, all sides of the Nb electrode layers 105A are protected from contamination.

Figure 3B:
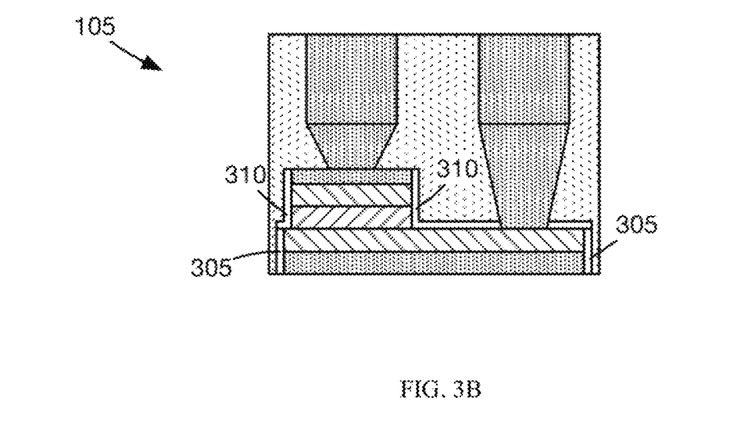
FIG. 3B illustrates a Josephson junction formed in the first group of layers of the fabrication stack, in accordance with example embodiments.

As shown in FIG. 3B, in examples of the Josephson junction 105, some portions of the sides of the Josephson junction 105 are encapsulated by a shunt/resistive layer 310 rather than silicon nitride layer 305, described above. In particular, the shunt layer 310 is configured to resistively couple the pair of Nb electrode layers 105A to one another. The shunt layer 310 is electrically equivalent to a resistor that is across the Nb electrodes 105B of the Josephson junction 105.

Some examples of the shunt layer comprise TaN or a material having a similar resistivity. In some examples, the shunt layer 310 has a thickness between about 10 nm-20 nm. TaN is a well-characterized alloy with the desired resistivity ρ=8-50 mΩ cm for a film thickness of 10-100 nm. TaN is "dirty" (short electron mean-free-path) and so will not form a parasitic Josephson junction across the barrier. The shunt resistance value scales with junction perimeter, not area. This means that Josephson junction characteristic voltage and corresponding time constants depend on device size, with larger junctions having less damping. The overall range of junction sizes is about 35-100 μA. In some examples, the shunt layer 310 targets the middle of the range.

Figure 4:
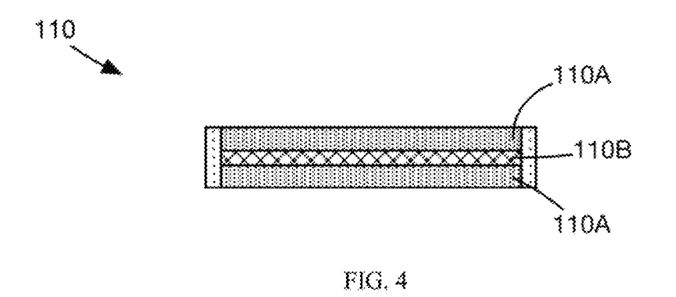
FIG. 4 illustrates a capacitor formed in the first group of layers of the fabrication stack, in accordance with example embodiments.

FIG. 4 illustrates an example of a capacitor 110 formed in the first group of layers 115A of the fabrication stack 100. The capacitor 110 corresponds to a metal-insulator-metal (MIM) capacitor and comprises a pair of NbTiN electrode layers 110A and a dielectric layer 110B between the pair of NbTiN electrode layers 110A.

Examples of capacitors 110 exhibit high integration density and facilitate energy-efficient AC power delivery for the superconducting circuits. For example, some examples of the superconducting circuits implement one or more local LC (e.g., inductor/capacitor) based AC power networks of which MIM capacitors are an element.

In some examples, the capacitors 110 are deposited using ALD. The capacitors are sized to provide bias current to the Josephson junction, typically $I_b \backslash I_c \approx 0.75$. This ratio of bias current and critical current is, in some cases, the most critical parameter in the superconducting circuit. Therefore, tight process control on capacitors 110 is an important consideration. The target for the 35 µA junction is 2.6 fF and scales linearly with junction size. The use of NbTiN for the electrodes 110A facilitates suppressing supercurrent leakage across the capacitor 110, due to a short superconductor coherence length relative to Nb.

Some examples of the dielectric layer 110B comprise hafnium oxide ($HfO_x$) or other similar oxides. $HfO_x$, in particular, is a good candidate material for the capacitor 110 due to its high dielectric constant, K. In an example, the area for the smallest capacitor 110 is $A=0.1$ $\mu m^2$, which corresponds to a capacitor 110 with K=32 and a 10 nm thickness.

In some examples, the hafnium oxide is doped (e.g., with Si or Zn) to facilitate tuning the capacitance of the capacitor 110 via a DC voltage provided across the pair of NbTiN electrode layers 110A. Tuning of the capacitor 110 facilitates frequency tunability of AC power delivery superconducting circuits.

Figure 5:
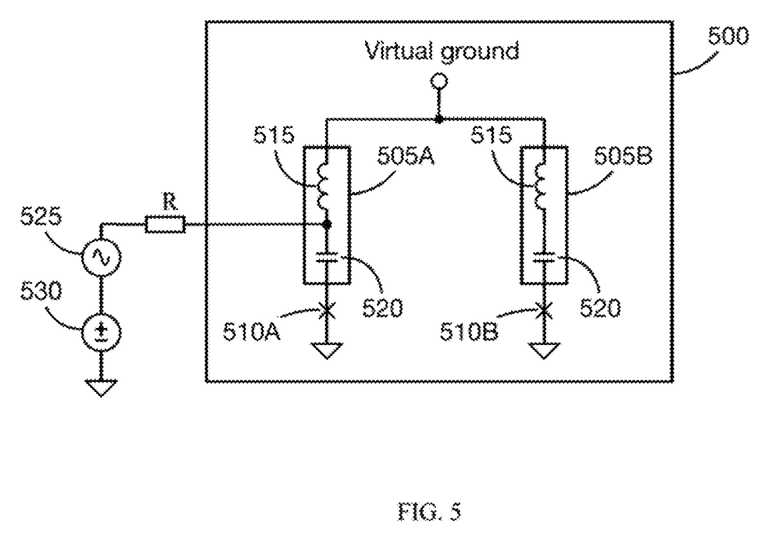
FIG. 5 illustrates a portion of an AC power delivery superconducting circuit that can be implemented via fabrication processes described herein, in accordance with example embodiments.

FIG. 5 illustrates an example of a portion of an AC power delivery superconducting circuit 500 that can be implemented via the fabrication processes described herein. The superconducting circuit 500 comprises a pair of resonators 505A, 505B and a pair of Josephson junctions 510A, 510B. Each resonator 505 of the pair comprises an inductor 515 and a capacitor 520 and has a resonant frequency that is a function of the inductance of the inductor 515 and the capacitance of the capacitor 520. In an example, the superconducting circuit 500 is one of many superconducting circuits 500 distributed across a chip for providing power and clock signals to RQL circuits across the chip. A first resonator 505A of each pair of resonators 505 is driven by one of a group of AC voltage sources 525 that outputs a particular frequency but at different phases (e.g., four phases, eight phases, etc.). This causes the first resonator 505A to resonate at a frequency and phase that substantially match the frequency and phase of the driving AC voltage source 525, respectively, and the second resonator 505B to resonate at a frequency that substantially matches the frequency of the driving AC voltage source 525 but at a phase that is about 180° out-of-phase with the driving AC voltage source 525. Generally, the loaded Q of these resonators 505 is high (e.g., Q>200). Without tuning, targeting the resonant frequency of resonators 505 distributed across a chip to match in frequency would require extremely high tolerances on geometrical and material parameters of the wires and capacitors. However, by doping the capacitor 520 as described herein, the resonators 505 can be tuned by, for example, ±10% by providing a DC voltage 530 across the capacitor in the range 1-5 V, depending on the films. The DC voltage does not otherwise adversely affect the dynamics of the Josephson junction 510. Different DC voltages can be applied to groups of resonators spread across the chip to compensate for the local spread of fabrication parameters.

Figure 6:
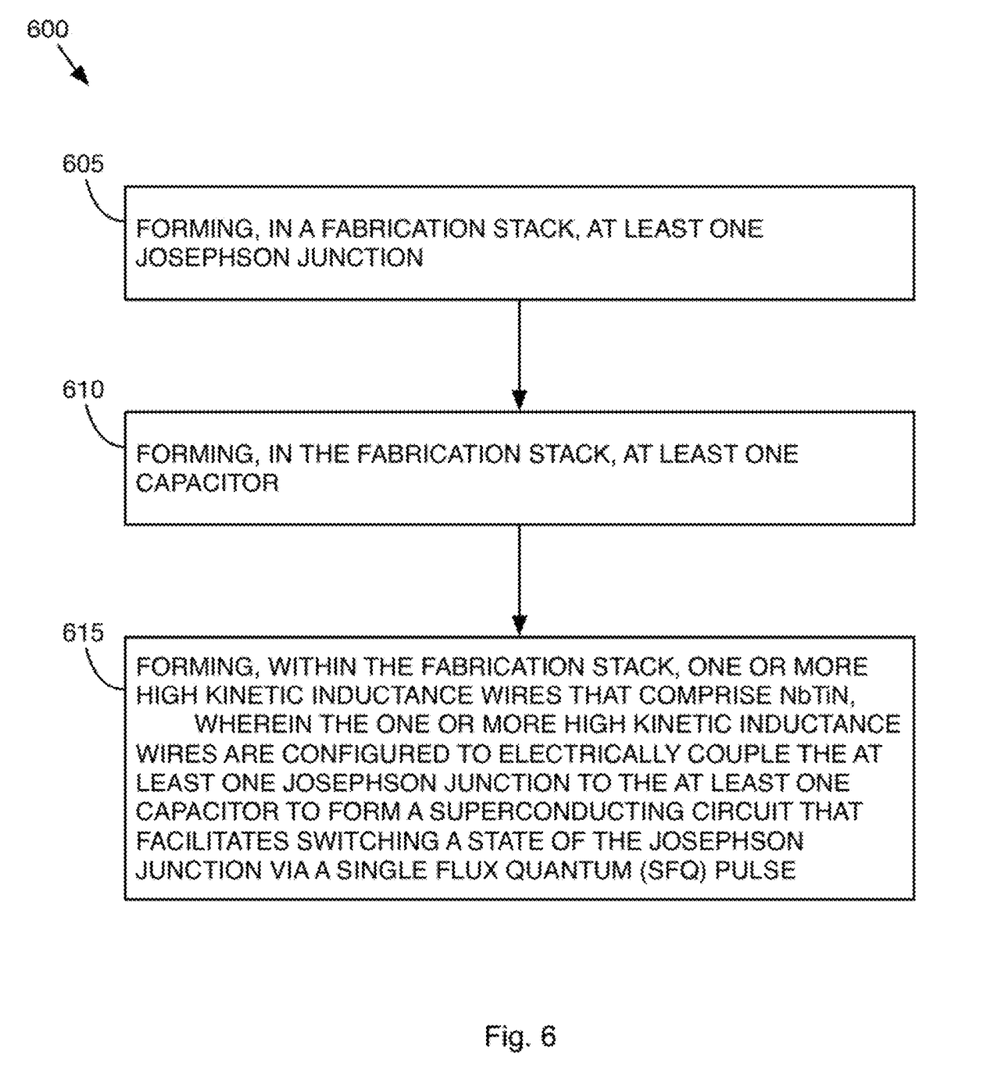
FIG. 6 illustrates operations that facilitate fabricating a superconducting circuit, in accordance with example embodiments.

FIG. 6 illustrates examples of operations 600 that facilitate fabricating a superconducting circuit. The operations at block 605 involve forming, in a fabrication stack 100, at least one Josephson junction 105.

The operations at block 610 involve forming, in the fabrication stack 100, at least one capacitor 110.

The operations at block 615 involve forming, within the fabrication stack 100, one or more high kinetic inductance wires that comprise NbTiN. The one or more high kinetic inductance wires are configured to electrically couple the at least one Josephson junction to the at least one capacitor 110 to form a superconducting circuit that facilitates switching a state of the Josephson junction 105 via a single flux quantum (SFQ) pulse.

In some examples of the operations, forming the at least one Josephson junction 105 involves forming, in the fabrication stack 100, a pair of Nb electrode layers 105A, forming, in the fabrication stack 100 and between the pair of Nb electrode layers 105A, an amorphous silicon layer 105B, and forming a pair of NbTiN electrode layers 105C over the pair of Nb electrode layers 105A. The NbTiN electrode layers 105C are configured to protect the pair of Nb electrode layers 105A from contamination during the formation of the fabrication stack 100.

Some examples further involve forming a silicon nitride layer 305 on one or more sides of the pair of Nb electrode layers 105A. The silicon nitride layer 305 is configured to protect the pair of Nb electrode layers 105A from contamination on the one or more sides of the pair of Nb electrode layers 105A during the formation of the fabrication stack 100.

Some examples further involve forming a shunt layer 310 on one or more sides of the pair of Nb electrode layers 105A configured to resistively couple the pair of Nb electrode layers 105A to one another.

In some examples of the operations, forming the shunt layer 310 involves forming a tantalum nitride layer on the side of each of the pair of Nb electrode layers 105A configured to resistively couple the pair of Nb electrode layers 105A to one another.

In some examples of the operations, forming the at least one capacitor 110 involves forming, in the fabrication stack, a pair of NbTiN electrode layers, and forming, in the fabrication stack and between the pair of NbTiN electrode layers 110A and a dielectric layer 110B.

In some examples of the operations, forming the dielectric layer 110B comprises forming a layer of hafnium oxide between the pair of NbTiN electrode layers 110A.

Some examples of the operations further involve doping the hafnium oxide to facilitate tuning the capacitance of the at least one capacitor 110 via a DC voltage provided across the pair of NbTiN electrode layers 110A of the at least one capacitor 110.

Some examples of the operations involve forming a pair of ground planes 117A, 117B between which the at least one Josephson junction 105, the at least one capacitor 110, and the one or more high kinetic inductance wires are formed. The pair of ground planes 117A, 117B comprise NbTiN. The pair of ground planes 117A, 117B are configured to have a critical temperature that is higher than a critical temperature of the at least one Josephson junction 105, the at least one capacitor 110, and the one or more high kinetic inductance wires to mitigate parasitic flux failure modes.

While some embodiments have been illustrated and described in detail in the appended drawings and the foregoing description, such illustration and description are to be considered illustrative and not restrictive. Other variations to

What is claimed is:

1. A fabrication stack comprising:
 a power distribution layer;
 a device layer configured to receive power from the power distribution layer, wherein the device layer includes:
  at least one Josephson junction;
  at least one capacitor, wherein the at least one Josephson junction is stacked adjacent to the at least one capacitor; and
  one or more high kinetic inductance wires that comprise NbTiN.

2. The fabrication stack according to claim 1, wherein the at least one Josephson junction comprises:
 a pair of Nb electrode layers;
 an amorphous silicon layer between the pair of Nb electrode layers; and
 a pair of NbTiN electrode layers over the pair of Nb electrode layers, wherein one of the pair of NbTiN electrode layers protects a top surface of one of the pair of Nb electrode layers and the other of the pair of NbTiN electrode layers protects a bottom surface of the other of the pair of Nb electrode layers from contamination during formation of the fabrication stack.

3. The fabrication stack according to claim 2, further comprising a silicon nitride layer adjacent to a sidewall of the pair of Nb electrode layers, wherein the silicon nitride layer protects the sidewall one or more sides of the pair of Nb electrode layers from contamination during formation of the fabrication stack.

4. The fabrication stack according to claim 2, further comprising a shunt layer on one or more sides of the pair of Nb electrode layers, wherein the shunt layer resistively couples the pair of Nb electrode layers to one another.

5. The fabrication stack according to claim 4, wherein the shunt layer comprises tantalum nitride.

6. The fabrication stack according to claim 1, wherein the at least one capacitor comprises:
 a pair of NbTiN electrode layers; and
 a dielectric layer between the pair of NbTiN electrode layers.

7. The fabrication stack according to claim 6, wherein the dielectric layer comprises hafnium oxide.

8. Fabrication stack according to claim 7, wherein the hafnium oxide is doped to tune a capacitance of the at least one capacitor via a DC voltage provided across the pair of NbTiN electrode layers of the at least one capacitor.

9. The fabrication stack according to claim 8, further comprising:
 at least one inductor, wherein the at least one inductor, the at least one capacitor, and the at least one Josephson junction form a superconducting series circuit having a resonant frequency that is a function of the inductance of the inductor and the capacitance of the capacitor, wherein the resonant frequency is tunable by adjusting the DC voltage across the pair of NbTiN electrode layers of the capacitor, and
 wherein the superconducting series circuit switches a state of the Josephson junction via a single flux quantum (SFQ) pulse.

10. The fabrication stack according to claim 1, further comprising a pair of ground planes between which the at least one Josephson junction, the at least one capacitor; and the one or more high kinetic inductance wires are formed, wherein the pair of ground planes comprise NbTiN, wherein the pair of ground planes are configured to have a critical temperature that is higher than a critical temperature of the at least one Josephson junction, the at least one capacitor, and the one or more high kinetic inductance wires to mitigate parasitic flux failure modes.

11. A method for fabricating a superconducting circuit, the method comprising:
 providing a power distribution layer as part of a fabrication stack; and
 providing a device layer configured to receive power from the power distribution layer, wherein the device layer includes:
  forming, in the fabrication stack, at least one Josephson junction;
  forming, in the fabrication stack, at least one capacitor, wherein the at least one Josephson junction is stacked adjacent to the at least one capacitor; and
  forming, within the fabrication stack, one or more high kinetic inductance wires that comprise NbTiN.

12. The method according to claim 11, wherein forming the at least one Josephson junction comprises:
 forming, in the fabrication stack, a pair of Nb electrode layers;
 forming, in the fabrication stack and between the pair of Nb electrode layers, an amorphous silicon layer;
 forming a pair of NbTiN electrode layers over the pair of Nb electrode layers, wherein one of the pair of NbTiN electrode layers are protects a top surface of one of the pair of Nb electrode layers and the other of the pair of NbTiN electrode layers protects a bottom surface of the other of the pair of Nb electrode layers from contamination during formation of the fabrication stack;
 forming a silicon nitride layer on one or more sides of the pair of Nb electrode layers, wherein the silicon nitride layer protects the pair of Nb electrode layers from contamination on the one or more sides of the pair of Nb electrode layers during formation of the fabrication stack; and
 forming a shunt layer on one or more sides of the pair of Nb electrode layers resistively couples the pair of Nb electrode layers to one another.

13. The method according to claim 12, wherein forming the shunt layer comprises forming a tantalum nitride layer on one or more sides of the pair of Nb electrode layers configured to resistively couple the pair of Nb electrode layers to one another.

14. The method according to claim 11, wherein forming the at least one capacitor comprises:
 forming, in the fabrication stack, a pair of NbTiN electrode layers; and
 forming, in the fabrication stack and between the pair of NbTiN electrode layers, a dielectric layer.

15. The method according to claim 14, wherein forming the dielectric layer comprises forming a layer of hafnium oxide between the pair of NbTiN electrode layers.

16. The method according to claim 15, further comprising doping the layer of hafnium oxide to tune electrode layers of the at least one capacitor.

17. The method according to claim 11, further comprising:
 forming a pair of ground planes between which the at least one Josephson junction, the at least one capacitor; and the one or more high kinetic inductance wires are formed, wherein the pair of ground planes comprise NbTiN, wherein the pair of ground planes are configured to have a critical temperature that is higher than a critical temperature of the at least one Josephson junction, the at least one capacitor, and the one or more high kinetic inductance wires to mitigate parasitic flux failure modes.

18. A device comprising a superconducting chip, wherein the superconducting chip comprises a fabrication stack that comprises:
   at least one Josephson junction;
   at least one capacitor, wherein the at least one Josephson junction is stacked adjacent to the at least one capacitor, and
   one or more high kinetic inductance wires that comprise NbTiN,
   wherein the high kinetic inductance wires electrically couple the at least one Josephson junction to the at least one capacitor to form a superconducting circuit that switches a state of the Josephson junction via a single flux quantum (SFQ) pulse.

19. The device according to claim 18, wherein the at least one Josephson junction comprises:
   a pair of Nb electrode layers;
   an amorphous silicon layer between the pair of Nb electrode layers;
   a pair of NbTiN electrode layers over the pair of Nb electrode layers, wherein the one of pair of NbTiN electrode layers protects a top surface of one of the pair of Nb electrode layers and the other of the pair of NbTiN electrode layers protects a bottom surface of the other of the pair of Nb electrode layers from contamination during formation of the fabrication stack;
   a silicon nitride layer on one or more sides of the pair of Nb electrode layers, wherein the silicon nitride layer protects the one or more sides of the pair of Nb electrode layers from contamination during formation of the fabrication stack; and
   a shunt layer on one or more sides of the pair of Nb electrode layers, wherein the shunt layer resistively couples the pair of Nb electrode layers to one another.

20. The device according to claim 18, wherein the at least one capacitor comprises:
   a pair of NbTiN electrode layers; and
   a dielectric layer between the pair of NbTiN electrode layers,
   wherein the dielectric layer comprises hafnium oxide, and
   wherein the hafnium oxide is doped to tune a capacitance of the at least one capacitor via a DC voltage provided across the pair of NbTiN electrode layers of the at least one capacitor.

21. A fabrication stack comprising:
   at least two groups of layers;
   a first group of layers of the at least two groups of layers includes:
      at least one Josephson junction;
      at least one capacitor, wherein the at least one Josephson junction is stacked adjacent to the at least one capacitor;
      an intermediate ground plane; and
      at least one high kinetic inductance wire that comprise NbTiN, wherein the high kinetic inductance wires electrically couple the at least one Josephson junction to the at least one capacitor to form a superconducting circuit, wherein the superconducting circuit switches a state of the Josephson junction via a single flux quantum (SFQ) pulse.

22. A method for forming a fabrication stack including at least two groups of layers, the method comprising:
   forming, in a first group of layers of the at least two groups of layers, a superconducting circuit, wherein forming the superconducting circuit comprises:
      forming at least one Josephson junction;
      forming at least one capacitor adjacent to the at least one Josephson junction; and
      forming one or more high kinetic inductance wires from NbTiN to electrically couple the at least one Josephson junction to the at least one capacitor to form;
   wherein the superconducting circuit switches a state of the Josephson junction via a single flux quantum (SFQ) pulse.

* * * * *